United States Patent [19]

Kearns et al.

[11] Patent Number: 4,494,107
[45] Date of Patent: Jan. 15, 1985

[54] DIGITAL TO ANALOG CONVERTER

[76] Inventors: Robert W. Kearns, 20524 Rutherford Ave., Detroit, Mich. 48235; James G. H. Quan, 14871 Lesure, Detroit, Mich. 48227

[21] Appl. No.: 250,482

[22] Filed: Apr. 2, 1981

Related U.S. Application Data

[63] Continuation of Ser. No. 781,817, Mar. 28, 1977, abandoned, which is a continuation of Ser. No. 651,321, Jan. 21, 1976, abandoned, which is a continuation of Ser. No. 367,286, Jun. 5, 1973, abandoned, which is a continuation of Ser. No. 873,192, Nov. 3, 1969, abandoned.

[51] Int. Cl.³ .................... H03K 13/02; H03F 3/45
[52] U.S. Cl. ................................ 340/347 DA; 330/69
[58] Field of Search ............... 340/146.2, 347 DA; 235/177, 150.5, 92 MP, 92 CA; 307/235 B, 235 A, 236; 330/300, 69; 324/115

[56] References Cited

U.S. PATENT DOCUMENTS

| | | | |
|---|---|---|---|
| 2,953,773 | 9/1960 | Nicolantonio | 340/146.2 |
| 3,025,414 | 3/1962 | McVey | 330/30 D |
| 3,032,268 | 5/1962 | Lucas et al. | 235/177 |
| 3,035,770 | 5/1962 | Mendelson et al. | 235/177 |
| 3,098,995 | 7/1963 | Mundt | 340/347 DA |
| 3,320,409 | 5/1967 | Larrowe | 340/347 DA |
| 3,383,594 | 5/1968 | Fiorletta et al. | 324/115 |
| 3,477,034 | 11/1969 | Gioia et al. | 330/69 |
| 3,502,905 | 3/1970 | Bicking | 330/30 D |
| 3,505,509 | 4/1970 | Sass | 235/154 |
| 3,588,882 | 6/1971 | Propster | 340/347 DA |
| 3,617,771 | 11/1971 | Lee | 330/30 D |

OTHER PUBLICATIONS

Sumilas, "Differential Amplifier", *IBM Tech. Disclosure Bulletin*, vol. 7, No. 3, 8-1964, pp. 200-201.
Cho, "Differential Input-Controlled Gates Oscillator", *Proc. of the IEEE*, vol. 53, No. 10, Oct. 1965, pp. 1641-1642.

Primary Examiner—Leo H. Boudreau
Attorney, Agent, or Firm—Barnes, Kisselle, Raisch, Choate, Whittemore & Hulbert

[57] ABSTRACT

A compensated differential amplifier connected to multiple analog ladder networks at each input which ladder networks are scaled with respect to each other and to the degree of possible compensation of the amplifier to provide a digital-to-analog converter which possesses characteristics of continuity and proportionality over the analog output range.

1 Claim, 6 Drawing Figures

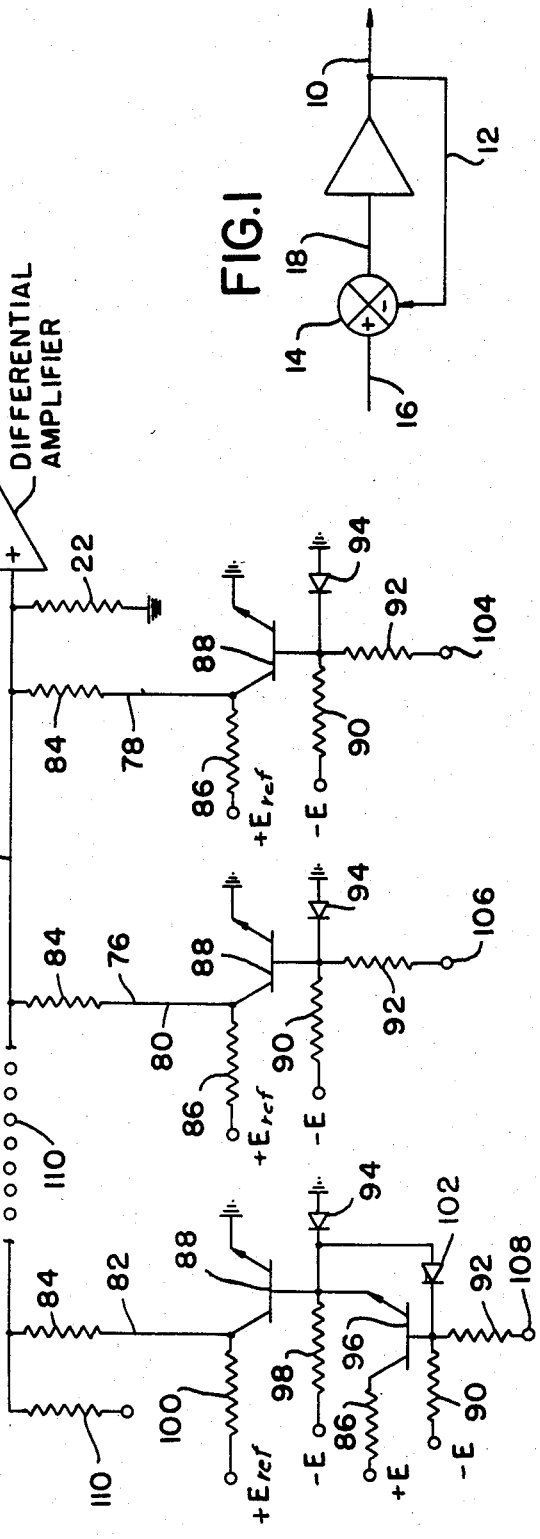
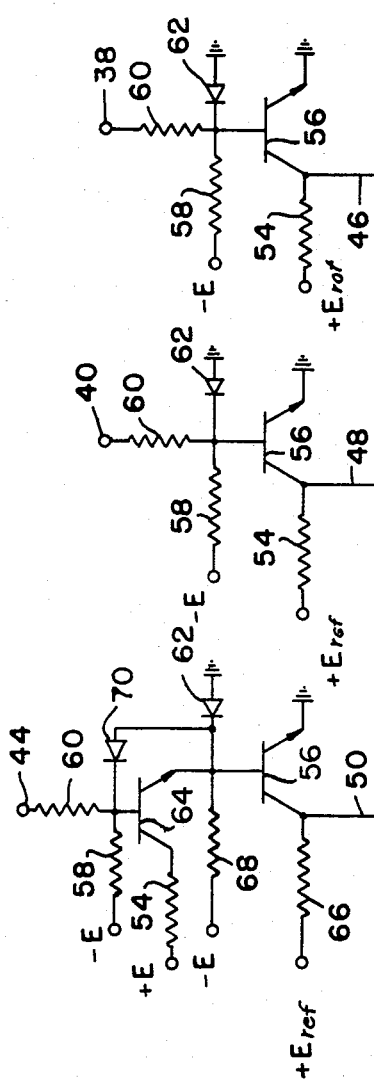
FIG.1
FIG.2

DIGITAL TO ANALOG CONVERTER

This application is a continuation of U.S. patent application Ser. No. 781,817, filed Mar. 28, 1977, now abandoned, which was a continuation of application Ser. No. 651,321, filed Jan. 21, 1976, now abandoned, which was a continuation of application Ser. No. 367,286, filed June 5, 1973, now abandoned, which was a continuation of application Ser. No. 873,192, filed Nov. 3, 1969, now abandoned.

BACKGROUND OF THE INVENTION

1. Field of the Invention

The invention relates to digital-to-analog converters and refers more specifically to a compensated differential amplifier and analog ladders at each input which are scaled with respect to each other and to the degree of possible compensation of the amplifier to provide a digital-to-analog converter having continuity and proportionality over the analog output range.

2. Description of the Prior Art

Where digital-to-analog conversion has been accomplished in the past, variations in the voltage drop across semi-conductors in a nominally conducting state has become a problem. Also, the usual analog resistance ladders for converting from digital to analog signals possess variable output signals with temperature changes which is undesirable.

There is developing a need for a digital comparator having an analog output which is simple in operation, economical to manufacture and efficient in use.

SUMMARY OF THE INVENTION

In accordance with the invention, digital signals may first be converted to analog signals and the analog signals subtracted in a differential amplifier.

The specific digital-to-analog converter disclosed includes a compensated differential amplifier having analog ladder input cicuits to the two sides thereof between which an input digital signal is divided.

The digital numbers may be in any weighted digital code and may, for example, be in the excess-3 code. Further, the digital signals need not be in the same code.

BRIEF DESCRIPTION OF THE DRAWINGS

FIG. 1 is a block diagram of a closed loop control system including a comparator constructed in accordance with the invention.

FIG. 2 is a partly block partly schematic diagram of comparator structure constructed in accordance with the invention for performing the method of the invention.

DESCRIPTION OF THE PREFERRED EMBODIMENT

Figure 3:
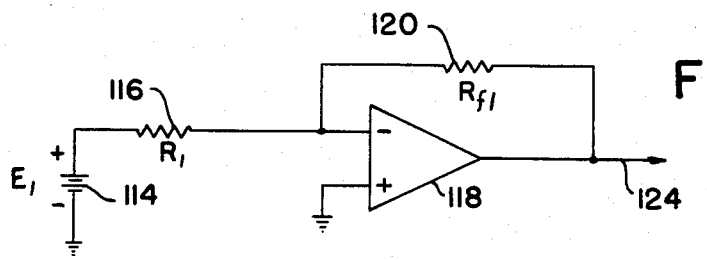
FIG. 3 is a partly block partly schematic diagram of a differential amplifier having an input signal applied to the inverting side thereof.

In the control circuit illustrated in FIG. 1, a controlled variable on conductor 10 is fed back through a conductor 12 to a comparing device 14 wherein it is compared with a reference signal on conductor 16 to provide an actuating signal output on conductor 18 which is operated on by device 19 to provide the controlled variable signal on the conductor 10.

Such control systems are closed loop systems and the signal on the conductor 18 serves to actuate the control system components so the system controls the controlled variable in a desired manner. To maintain a closed loop system both stable and accurate it is desirable that all elements in the control loop operate with a minimum time delay. In particular it is desirable that comparison in the comparing device 14 be accomplished with a minimum of delay.

The advantages of digital techniques to the control designer in designing such systems are accuracy and resolution independent of full scale magnitude, computer control compatibility and the option of absolute reference for the system.

Referring to FIG. 2, each of the portions of the analog ladder 36 includes a resistor 52, which is weighted, in accordance with a predetermined code, as for example, the binary code. Thus, each resistor proceeding from the right ladder portion 46 to the end ladder portion 50 is half the value of the preceding resistor so that the ladder portion 50 is the most significant position in the digital input signal at the terminals 38, 40 and 44 and all the terminals between the terminals 40 and 44 which are not shown. A second similarly weighted resistor 54 is shown serially connected to each resistor 52 and to a source of positive electrical potential which may be for example $+E_{ref}$ which is nominally +15 volts.

Each of the analog ladder portions also includes a transistor 56 having emitter base and collector connected as shown. The base of the transistors 56 are connected through a resistor 58 to a negative power supply of, for example, −15 volts and through a resistor 60 to an input terminal. Diodes 62 are provided to protect the transistors 56. The negative supply provides a degree of noise immunity.

In addition, in the more significant positions, as in the analog ladder portion 50, a second transistor 64 having emitter base and collector electrodes connected as shown is provided between the resistors 58 and 60 and the transistors 56. The positive power supply is connected to each transistor 64 through a resistor 54, the negative power supply is connected through a resistor 68, and a separate protecting diode 70 is provided in conjunction with each transistor 64. The transistors 64 and their associated circuitry maintain the input terminal characteristics of all portions of the analog ladder 36 of the comparator 14 shown in FIG. 2 at a similar level so that external circuits are not required to compensate for the additional current necessary in the more significant positions of the ladder.

In addition, a resistor 72 adapted to be connected to a source of reference electrical energy is provided connected to the conductor 26 for use when the code applied to the non-inverting input terminal of the differential amplifier 20 is an excess-3 code. Resistor 72 serves to provide an additional subtraction of a reference voltage quantity equal to an analog 3, 33, 333, etc., so that the excess-3 code will be accommodated on input terminals 104 through 108 using a weighted binary digital code on the non-inverting input electrode of the differential amplifier 20.

The analog ladder 76 connected to the non-inverting input terminal of amplifier 20 through conductor 28 similarly includes the separate portions 78, 80 and 82, each including resistors 84 and 86, a transistor 88, resistors 90 and 92 and a diode 94. The more significant positions of the analog ladder 76 as before include an extra transistor 96, resistor 98, resistor 100 and protecting diode 102.

A digitally coded input signal is applied to the ladder 76 with the digitally coded input signal for the ladder 36 in the differential amplifier 20 over the terminals 104, 106 and 108 in addition to a plurality of terminals 110 between the terminals 106 and 108. Again, resistor 110 is provided for an excess-3 binary code input.

Due to the differential nature of the circuit, and the fact that only one power supply ($+E_{ref.}$) is required, variations in components with temperatures and variations in power supply tend to track together and ultimately cancel or be minimized. Thus, while offset voltages as $V_{CE(sat.)}$ may be worth 20 millivolts, not only do the offset quantities cancel to zero, but variations in the 20 millivolt quantities result in variations of the output quantity of only, say, 2 millivolts. It should be pointed out, however, that at times it may be desired to multiply the input signal to either ladder 36 or 76 by applying a different ($+E_{ref.}$) to the ladders either or both of which could be variable.

If either of the input codes to the ladders 36 and 76 is an excess-3 digital code, an input signal weighted 3, 33, 333, etc., will be provided through the resistor 72 or 110 to the conductor 26 or 28 in conjunction with the opposite analog ladder. Thus, the excess-3 value will be removed in the differential amplifier 20 so the ladder can be constructed with binary weighted components.

A basic differential amplifier circuit is shown in FIG. 3 in which a voltage input is provided from the source of direct current energy 114 through resistor 116 to the inverting input terminal of an amplifier 118 similar to amplifier 20 and including the resistor 120 to provide an output on conductor 124. The basic and well-known equation with the indicated notation for the output of the ideal differential amplifier of FIG. 3 is:

$$\frac{E_{1out}}{E_{1in}} = -\frac{R_{f1}}{R_1} \quad (1)$$

Figure 4:
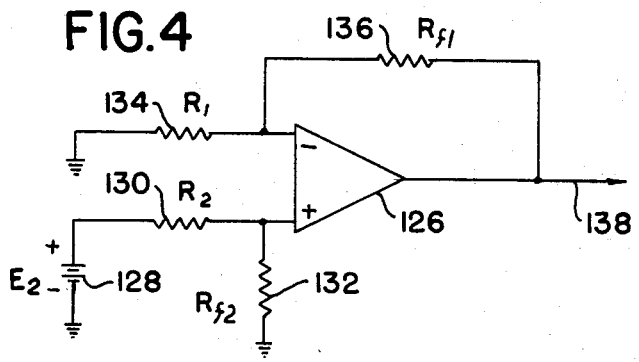
FIG. 4 is a partly block partly schematic diagram of a differential amplifier having an input signal applied to the non-inverting side thereof.

A similar operational amplifier 126 having an input only on the non-inverting side from the signal generator 128 through resistor 130 and across resistor 132 and including resistor 134 connected to the inverting input conductor of the amplifier and resistor 136 for providing an output on conductor 138 is illustrated in FIG. 4. The basic and well-known equation indicating the output on conductor 138 from amplifier 126, considering that the amplifier is ideal, is:

$$E_{out2} = E_2 \left( \frac{R_{f2}}{R_2 + R_{f2}} \right) \left( \frac{R_1 + R_{f1}}{R_1} \right) \quad (2)$$

The total analog signal out of a differential amplifier 20 when operated within its linear range wherein there are input signals on both conductors 26 and 28 may then be given by combined equations (1) and (2). In other words:

$$E_{out} = E_{out1} + E_{out2}$$

Figure 5:
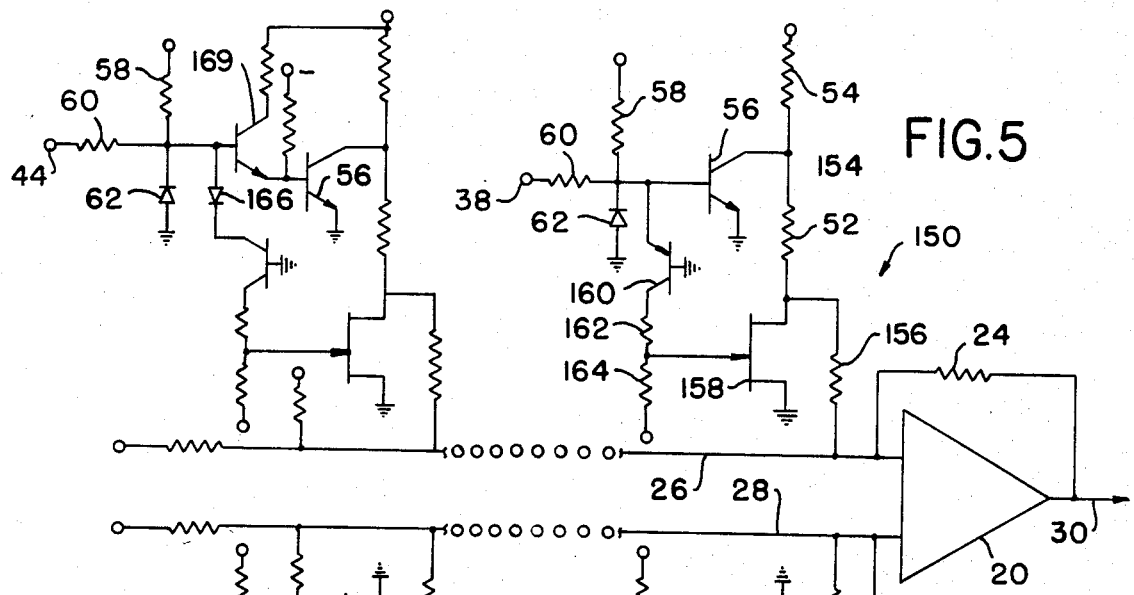
FIG. 5 is a partly block partly schematic diagram of a modification of the comparator structure of FIG. 2.

Referring now to FIG. 5, in those cases wherein the $V_{CE(sat.)}$ voltage across the transistors 56 and 88 are objectionable, so that additional expense is warranted to improve the accuracy of the comparator 14, a modified comparator 150 which is similar to comparator 14 may be provided. Both the ladders 154 and 152 as shown in FIG. 5 include a third weighted resistor 156, a field-effect transistor 158, an actuating transistor 160 and resistors 162 and 164 connected to a $-E$ as shown.

The operation of the comparator 150 is similar to the operation of the comparator 14 and therefore only the improved definition permitted by the addition of the third weighted resistor 156, the field-effect transistor 158 and the associated circuitry will be considered at this time.

The field-effect transistor 158 is primarily a resistance device in which the resistance is varied between, for example, 125 Ohms with transistor 160 turned on and substantially infinite resistance with the transistor 160 off. Thus, when the transistor 56, which is provided the same number as in the comparator 14, is in an ON condition, the voltage at the collector of transistor 56 is approximately 0.017 volts. If the field-effect transistor 158 possesses at this time a resistance of, for example, 125 Ohms in series with an 8,000 Ohm resistance of resistor 52, the voltage at the junction between resistors 52 and 156 will be attenuated to approximately 0.026 millivolts. This voltage is more nearly the ideal value of ground so that variations with temperature, for example, in this voltage are reduced correspondingly as well.

When the field-effect transistor 158 is turned off, the resistance of the field-effect transistor 158 is so high as to effectively take the transistor out of the circuit, the transistor 160 is also OFF so the gate of transistor 158 is at $-E$, a value which is above the pinch-off voltage. When transistor 160 is turned ON, as by an input signal to an input conductor 38 of the comparator 154, the voltage at the junction of resistors 162 and 164 is near ground, resulting in transistor 158's low resistance. When transistor 160 is OFF, the voltage is near $-E$ resulting in transistor 158's high resistance. An additional diode 166 is provided when an additional transistor 169 is used with the transistor 56. This diode allows compatible voltage drops for operation of transistors 56 and 168.

Figure 6:
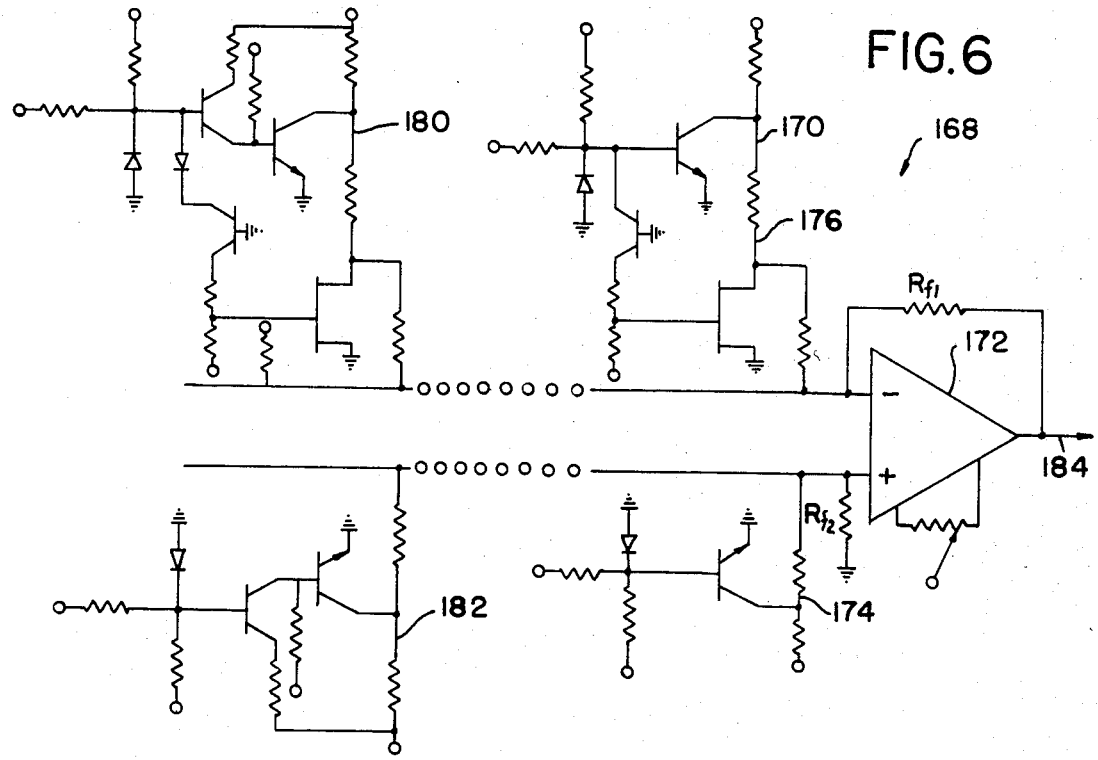
FIG. 6 is a partly block partly schematic diagram of a digital-to-analog converter constructed in accordance with the invention.

The digital-to-analog converter illustrated in FIG. 6 makes use of a triple analog ladder 170 feeding the inverting input terminal of the compensated differential amplifier 172 and a double analog ladder 174 feeding the non-inverting input terminal of the amplifier 172.

Eight input terminals of a twelve-place converter may be provided by the analog ladder 170, and four inputs may be provided by the ladder 174, for example. The inputs to the ladder 170 will be the most significant positions. Further, the signal from the least significant position, that is, the ladder portion 176 of ladder 170, must be not more than the unbalance compensation adjustment provided in the design of the differential amplifier 172.

With such an arrangement, the amplifier 172 may be intentionally unbalanced for the maximum voltage range of the ladder 174 which for example in the binary code is one unit less than the weight of the ladder portion 176. The effect then with the resistors weighted to provide the most significant position in the ladder portion 180 of ladder 170 and the least significant position in the ladder portion 182 of the ladder 174, is to offset the differential amplifier 172 an amount equal to the complete input from the non-inverting terminal thereof so that instead of subtracting the analog input from the ladders 170 and 174, the analog input will be added to provide an analog output on the conductor 184 equal to the digital input to the two ladders 170 and 174.

The converter 168 will not require the usual large range of resistor values since each ladder can use an independent scale factor. A different scale factor occurs when $R_{f2}$ is not equal to $R_{f1}$. This method will allow a further increase in resolution, even if the precision of the 170 ladder is not increased since the added signal will vary the output in the correct direction.

What we claim as our invention is:

1. A digital-to-analog converter comprising a primary analog input network for receiving a part of a digital word and converting it into an analog signal, a secondary analog input network for receiving another part of the digital word and converting it into an analog signal with the maximum digital input word put into the secondary analog input network being nominally slightly less than the least change in the portion of the digital word input to the primary analog input network and an unbalanced differential amplifier connected to receive the output from the primary analog input network at one input terminal thereof and for receiving the output from the secondary analog input network at the other input terminal thereof in which the maximum amount of unbalance of the differential amplifier is nominally equal to the maximum analog signal from the secondary analog input network.

* * * * *